United States Patent [19]

Barnett et al.

[11] 4,239,553
[45] Dec. 16, 1980

[54] THIN FILM PHOTOVOLTAIC CELLS HAVING INCREASED DURABILITY AND OPERATING LIFE AND METHOD FOR MAKING SAME

[75] Inventors: Allen M. Barnett, Newark; James V. Masi, Wilmington; Robert B. Hall, Newark, all of Del.

[73] Assignee: University of Delaware, Newark, Del.

[21] Appl. No.: 43,316

[22] Filed: May 29, 1979

[51] Int. Cl.$^3$ .................. H01L 31/06; B05D 5/12
[52] U.S. Cl. .................. 136/256; 136/265; 136/260; 29/572; 427/74; 427/76; 427/248.1; 357/30; 357/52; 357/73; 204/192 SP
[58] Field of Search ........ 136/89 CD, 89 CU, 89 TF, 136/89 CA, 89 CC, 89 EP; 427/74, 76; 29/572; 357/30, 52, 73; 204/192 SP

[56] References Cited

U.S. PATENT DOCUMENTS 3,888,697  6/1975  Bogus et al. ................. 136/89

OTHER PUBLICATIONS

F. A. Shirland et al., "Materials for Low-Cost Solar Cells," *Rep. Prog. Phys.*, vol. 41, pp. 1857-1873 (1978).
R. B. Hall et al., "The Design & Fabrication of High Efficiency Thin Film CdS/Cu$_2$S Solar Cells," *Thin Solid Films*, vol. 63, pp. 203-211 (1979).
K. A. Andrianov et al., "Stabilization of The Characteristics of CdS Film Photoconverters," *Applied Solar Energy*, vol. 11, pp. 61-64 (1975).
A. M. Barnett et al., "Advances in the Development of Efficient Thin Film CdS/Cu$_2$S Solar Cells," *Conf. Record, 12th IEEE Photovoltaic Specialists Conf.* (1976), pp. 544-546.
Memorandum, University of Delaware, Anthony Catalano to Dr. George Warfield, Oct. 10, 1975.
W. Arndt et al., "CdS-Cu$_2$S Thin Film Solar Cells for Terrestrial Applications," *Proceedings Int'l Solar Energy Conf.*, Luxembourg (1977), Reidel Pub. Co. (1978), pp. 547-556.
K. Bogus et al., "High Efficiency Cu$_2$S-CdS Solar Cells with Improved Thermal Stability," *Conf. Record, 9th IEEE Photovoltaic Specialists Conf.* (1972), pp. 106-110.
H. M. Windawi, "Stoichiometric Effects & Carrier Density of Cu$_x$S," Presented at 1st Int'l Workshop on CdS Solar Cells, Newark, Del., Apr.-May 1975, pp. 177-190.
G. H. Hewig et al., "The Influence of the Horizontal & Vertical Structure of the p-n Junction in Cu$_2$S-CdS Solar Cells," *Conf. Record, 12th IEEE Photovoltaic Specialists Conf.* (1976), pp. 483-487.
F. Pfisterer et al., "Performance of Cu$_x$S-CdS Solar Cells After Additional Cu Treatment," *Conf. Record, 11th IEEE Photovoltaic Specialists Conf.* (1975), pp. 460-463.
F. Pfisterer et al., "Post-Fabrication Treatments, Surface Properties, and Front Contact of Cu$_x$S-CdS Solar Cells," *Conf. Record, 12th IEEE Photovoltaic Specialists Conf.*, (1976), pp. 502-507.

*Primary Examiner*—Aaron Weisstuch
*Attorney, Agent, or Firm*—Connolly and Hutz

[57] ABSTRACT

A solar cell having a copper-bearing absorber is provided with a composite transparent encapsulating layer specifically designed to prevent oxidation of the copper sulfide. In a preferred embodiment, the absorber is a layer of copper sulfide and the composite layer comprises a thin layer of copper oxide formed on the copper sulfide and a layer of encapsulating glass formed on the oxide. It is anticipated that such devices, when exposed to normal operating conditions of various terrestrial applications, can be maintained at energy conversion efficiencies greater than one-half the original conversion efficiency for periods as long as thirty years.

15 Claims, 2 Drawing Figures

THIN FILM PHOTOVOLTAIC CELLS HAVING INCREASED DURABILITY AND OPERATING LIFE AND METHOD FOR MAKING SAME

The United States Government has rights in this invention pursuant to subcontract number XR-9-8063-1 awarded by The Solar Energy Research Institute under contract number EC-77-C-01-4042 awarded by the United States Department of Energy.

BACKGROUND OF INVENTION

1. The Nature of Photovoltaic Cells

A photovoltaic cell, often referred to as a solar cell, is a semiconductor junction device which converts light energy into electrical energy. A typical photovoltaic cell is a layered structure comprising four principal layers: (1) an absorber-generator (2) a collector-converter (3) a transparent electrical contact and (4) an opaque electrical contact. When light is shone into the absorber-generator, the device generates a voltage differential between the two contacts and an electric current which increases as the intensity of the light increases.

The absorber-generator (commonly referred to as the "absorber") is a layer of semiconductor material which absorbs light photons and, as a consequence, generates minority carriers. Typically the absorber absorbs photons and ejects electrons thus creating pairs of negatively charged carriers (electrons) and positively charged carriers ("holes"). If the absorber is a p-type semiconductor, the electrons are minority carriers; if it is n-type, the holes are minority carriers. As minority carriers are readily annihilated in the absorber by recombination with the plentiful majority carriers, they must be transported to a region wherein they are majority carriers before they can be utilized to power an electrical circuit.

The collector-converter (the "collector") is a layer of material is electrical contact with the absorber wherein the majority carriers are of the same conductivity type as the minority carriers generated in the absorber. This layer "collects" minority carriers from the absorber and "converts" them into majority carriers. If the collector is an oppositely doped region of the same semiconductor as the absorber, the photovoltaic devide is a homojunction device. If the collector is comprised of a different semiconductor, the device is a heterojunction; and, if the collector is metal, the device is a Schottky barrier junction.

The transparent contact is made of an electrically conductive material which permits light to pass through to the absorber. It is typically either a continuous transparent sheet of conductive material or an open grid of opaque conductive material. If the transparent contact is on the same side of the photovoltaic device as the absorber, the device is referred to as being in the front wall configuration. If the transparent contact is on the opposite side, the device is said to be in the back wall configuration.

2. History of the Art

Although scientists have known about the photovoltaic effect for more than a century, it is only within the past twenty-five years that it could be considered a practical means for generating electricity in useful amounts. Prior to 1950, photovoltaic devices were limited in use to highly specialized applications, such as light metering, wherein conversion efficiency was immaterial and electrical current demand was minimal.

The advent of silicon junction technology in the 1950's permitted the development of high cost, high conversion efficiency silicon junction photovoltaic cells. Arrays of such devices have been used with considerable success in the space program where cost is of little significance. However, the cost of such devices as energy generators, typically exceeding $10,000 per kilowatt, is prohibitively high for terrestrial applications wherein they must compete against conventional generators. While much of this coat is due to the high quality control standards required for spacecraft components, a substantial portion is due to the high cost of preparing silicon crystals of the required purity and due to the inefficiencies of the batch processes by which such cells are fabricated.

Thin film photovoltaic cells possess many potential advantages over silicon cells in terrestrial applications. Photovoltaic cells employing thin films of polycrystalline materials such as a copper sulfide absorber and a cadmium sulfide converter offer substantial advantages for the development of continuous processing techniques, and they are flexible and light of weight. Consequently they offer much promise as cells which can be easily fabricated, transported and deployed.

One difficulty that arises in the use of thin film photovoltaic cells utilizing copper-bearing absorbers is a gradual degradation of their energy conversion characteristics. When deployed in the field as solar cells, such cells gradually lose their ability to collect and convert solar energy into electrical energy. Typical copper sulfide cells lose approximately 29 percent of their conversion efficiency within a period of about two years. Such degradation would present serious difficulties in large-scale solar cell deployments.

SUMMARY OF INVENTION

The present applicants have recognized that a primary source of long-term degradation in solar cells utilizing copper-bearing absorbers is oxidation of copper. Such oxidation, caused by the penetration of air, moisture and oxygen through the encapsulant, alters the stoichiometry of the copper-bearing absorber. This alteration, in turn, reduces the minority carrier diffusion length in the absorber. As a consequence, minority carriers created in the absorber by sunlight recombine before they can diffuse to the converter and be converted into electrical power. In addition, alteration of stoichiometry reduces the absorptivity of the copper bearing absorber. As a consequence, a lesser number of photons are absorbed and fewer minority carriers are generated.

In accordance with the invention, a solar cell having a copper-bearing absorber is provided with a composite transparent encapsulating layer specifically designed to prevent oxidation of the copper. in a preferred embodiment, the absorber is a layer of copper sulfide and the composite layer comprises a thin layer of copper oxide formed on the copper sulfide and a layer of encapsulating glass formed on the oxide. It is anticipated that such devices, when exposed to normal operating conditions of various terrestrial applications, can be maintained at energy conversion efficiencies greater than one-half the original conversion efficiency for periods as long as thirty years.

BRIEF DESCRIPTION OF THE DRAWINGS

The nature, advantages and various additional features of the invention will appear more fully upon consideration of the illustrative embodiments now to be described in detail in connection with the accompanying drawings.

In the drawings.

DETAILED DESCRIPTION

Figure 1:
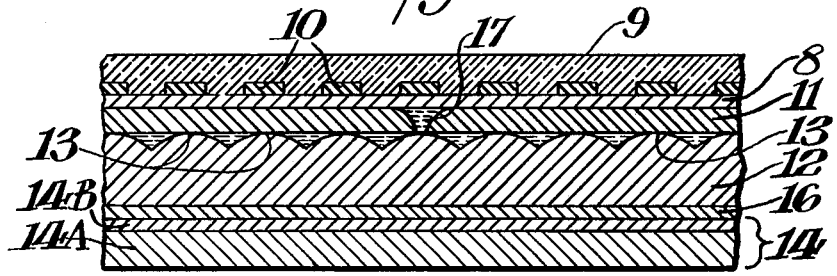
FIG. 1 is a schematic cross section with portions enlarged, of a thin film photovoltaic cell in accordance with the invention.

Referring to the drawings, FIG. 1 is a schematic cross section of a thin film photovoltaic device including composite encapsulation in accordance with the invention. In essence, the device comprises, as successive components in the electrical path therethrough, a first transparent electrical contact means 10 such as a gold, silver, nickel, copper or metal alloy grid electrode; a copper-bearing absorber-generator 11, such as a thin film of copper sulfide, disposed in electrical contact with grid electrical contact 10, a collector-converter 12, such as a film of cadmium sulfide or zinc cadmium sulfide ($Zn_xCd_{1-x}S$; $0 \leq X \leq 0.3$), disposed in contact with the absorber and forming a junction 13, therewith; and a second electrical contact 14, such as a layer of zinc-plated copper foil or brass making electrical contact with the collector 12. In a typical thin film photovoltaic device, the copper sulfide absorber will have a thickness on the order of 1000 to 5000 angstroms; the cadmium sulfide collector will have a thickness of approximately 2 to 40 microns; and the copper foil 14A contact will have a zinc plate 14B of about 0.5 micron or less.

In accordance with the invention, the durability and useful operating life of the cell is substantially increased by encapsulating the copper-bearing absorber-generator with a thin film of copper oxide 8 and a layer 9 of transparent glass. The copper oxide can be disposed either between the grid contact and the absorber or it can be applied over both the grid and the exposed absorber. Preferably the copper oxide has a thickness of 100 angstroms to 10,000 angstroms. The glass preferably has a thickness of 1 to 30 microns, and advantageously, 2 to 20 microns.

A preferred glass composition for this application is an alumino-borosilicate having oxide components and the following proportions by mole percentage:

$SiO_2$: 49%
$B_2O_3$: 14.5%
$Al_2O_3$ MgO: 10.5%
BaO: 25%
PbO: 1%.

The term glass as used herein refers to quenched liquids having a viscosity in excess of about $10^8$ poise at ambient temperature which are generally characterized by: (1) the presence of a single phase (2) gradual softening and subsequent melting with increasing temperature, rather than sharp melting characteristics (3) conchoidal fracture and (4) the absence of crystalline X-ray diffraction peaks.

The advantage of using this composite encapsulating layer is substantially increased durability and operating life. The layer of copper oxide is chemically and electrically compatible with the underlying copper-bearing absorber and acts as an excellent barrier to the passage of oxygen. In addition, it greatly facilitates bonding of the glass to the device and substantially reduces the tendency of the glass to crack and microfissure. Oxygen, moisture and air are kept from the copper-bearing absorber, thereby preserving the stoichiometry of the copper-bearing layer. Preliminary tests indicate that with this encapsulation system, less than two percent of the device surface area will be exposed to oxygen via cracks and microfissures, and the device can be expected to operate about thirty years before its conversion efficiency is halved.

Although copper oxide is the preferred barrier member, other materials may be used within the broad concepts of this invention, particularly various oxides such as indium oxide and tin oxide as well as other materials capable of functioning as transparent barriers layers or transparent conductors.

Shorts between the transparent contact 10 and the opaque contact 14 are preferably prevented by disposing a blocking layer 16 such as a thin layer of semiconductor between the opaque contact and the collector in regions of probable shorting. In this specific embodiment, a semiconducting layer of zinc sulfide is formed on the opaque contact before deposition of the collector.

Shorts between the transparent contact 10 and the collector 12 are preferably prevented by forming between the transparent contact and the collector a thin discontinuous blocking layer 17 of material which forms an insulator, such as cadmium sulfate.

Shorts between the absorber 11 and the opaque contact 14 are preferably prevented by forming a blocking layer of material of an electron affinity such as will not pass significant current at solar cell operating voltages. Such a material is zinc sulfide layer 16 which is deposited on the opaque contact, prior to deposition of the CdS.

Figure 2:
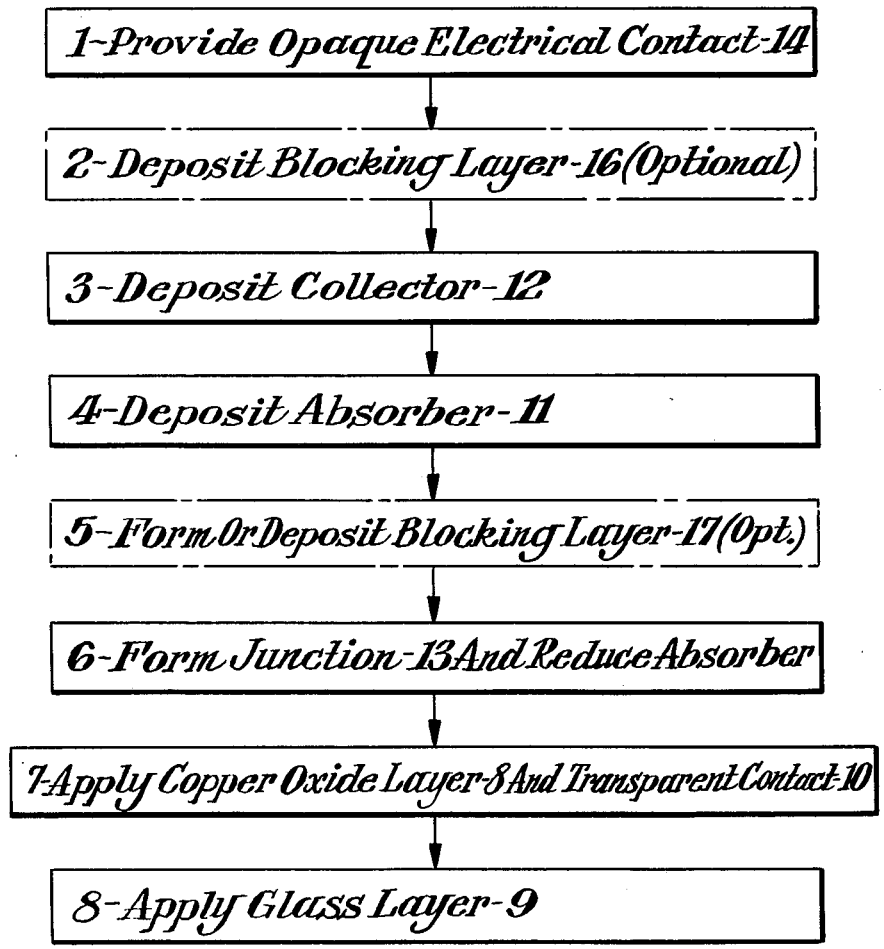
FIG. 2 is a flow diagram of the steps of a preferred method of fabricating a thin film photovoltaic cell in accordance with the invention.

FIG. 2 is a schematic flow diagram illustrating the preferred method for fabricating a thin film photovoltaic cell in accordance with the invention. As illustrated, the first step involves providing an opaque electrical contact which is conveniently used as a substrate during the remainder of the process. In the fabrication of the device of FIG. 1, this step is preferably effectuated by (a) providing copper foil, (b) cleaning the foil surfaces electrolytically and by immersion in sulphuric acid, and (c) depositing a thin layer of zinc on the cleaned surface by electroplating.

The next step involves forming blocking layer 16 which is preferably a layer of zinc sulfide. Such a layer is formed by depositing a 0.5 to 2 micron average thickness layer of zinc sulfide by vacuum evaporation or by chemical desposition.

The next step involves depositing a collector-converter. In fabricating the device of FIG. 1, this step is preferably effected by evaporation deposition of a cadmium sulfide collector. The collector surface can also be textured as by etching in hydrochloric acid, to promote efficient light collection. A two to four second dip in 55% V/V concentration HCl at 60° C. has been found satisfactory.

The next step involves depositing an absorber-generator on the collector and forming a junction between the absorber and the collector. In the fabrication of the FIG. 1 device, this step is preferably effectuated by growing $Cu_2S$ on the CdS by an ion exchange process using an aqueous solution of cuprous chloride. A ten-second dip has been found satisfactory in the following bath composition, from which oxygen has been excluded:

| Component | Quantity |
| --- | --- |
| Deionized water | 4 liters |
| CuCl | 24 grams |
| NaCl | 8 grams |
| HCl | pH of 2-3 |
| Temperature | 90°-100° C. |

Any portion of the cadmium sulfide not covered by the absorber can advantageously be converted into a cadmium sulfate blocking layer 17 by heat treating the structure in an oxygen containing atmosphere such as air at a temperature of 200° C. for two minutes.

The resulting structure is then heat treated in a reducing atmosphere to complete the formation of an acceptable junction between the cadmium sulfate and the copper sulfide and to take the copper sulfide to its desired stoichiometric condition. During the heat treatment, copper sulfide diffuses into the cadmium sulfide and "dopes" it in the interfacial region. In addition, the reducing atmosphere chemically reduces oxides, such as $Cu_2O$, that form on the free surface of the $Cu_2S$ without completely reducing the cadmium sulfate layer 17. A ten-hour heat treatment in a 90% argon-10% hydrogen atmosphere at 170° C. has been found satisfactory. Alternatively, exposure to either a 10% hydrogen-90% argon atmosphere or a carbon monoxide atmosphere at 300° C. for two minutes is also satisfactory.

After the surface has been heated, reduced and thereby dried, a thin layer of copper oxide 8 is applied. Advantageously, as a preliminary step, a thin layer of copper approximately 10 to 50 angstroms thick can be deposited onto the copper sulfide by vacuum evaporation or electrochemical techniques, and the resulting structure heated in air at approximately 200° C. for ten minutes. Then sufficient additional copper oxide ($Cu_2O$) is deposited by standard vacuum evaporation or sputtering techniques to produce a copper oxide layer having a total thickness preferably between 100 angstroms and 10,000 angstroms. The advantage of the initial copper plating step is that some copper atoms are driven into the copper sulfide, assuring optimum stoichiometry.

The transparent contact, preferably a grid, is applied to the copper oxide coated surface by printing or vacuum evaporation through a suitable mask. Alternatively, the transparent contact can be applied to the absorber prior to deposition of the copper oxide.

The final step involves applying over the grid and copper oxide, a layer of glass having a thickness of 1 to 30 microns. The glass can be deposited by standard thermal evaporation, by sputtering, by ion plating or by flame or plasma spraying. If desired, the top surface of the glass can be textured in order to maximize trapping of light entering the device.

It is to be understood that throughout this specification and the appended claims that the term copper-bearing absorber embraces not only a layer of copper sulfide, but also other copper-bearing compounds useful as absorbers in photovoltaic cells, such as copper indium selenide ($CuInSe_2$) and copper indium sulfide ($CuInS_2$).

While the invention has been described in connection with but a small number of specific embodiments, it is to be understood that these are merely illustrative of many other specific embodiments which can also utilize the principles of the invention. For example, while the invention has been described in connection with the encapsulation of only copper-bearing absorbers, it also has application to photovoltaic cells having other types of absorbers compatible with copper oxide, such as zinc phosphide and amorphous silicon. Thus, numerous and varied devices can be made by those skilled in the art without departing from the spirit and scope of the present invention.

What is claimed is:

1. In a photovoltaic device of the type comprising a first electrical contact means, a layer of absorber material in ohmic electrical contact with said first electrical contact means, transparent encapsulation means overlying said first electrical contact means and said absorber a layer of collector material in rectifying electrical contact with said absorber and forming a junction therewith, and a second electrical contact means in ohmic electrical contact with said collector, the improvement being said encapsulant means comprises a composite layer of a barrier member and an overlying thin layer of glass, said barrier member having a thickness between 100 and 10,000 angstroms, said glass being bonded directly to said barrier member, said barrier member being made of a material which is chemically and electrically compatible with the material of said absorber, and said barrier member material being capable of minimizing passage of oxygen and of bonding glass and of reducing the tendency of glass to crack and microfissure thereby facilitating bonding said layer of glass to the remainder of said device and minimizing the occurrence of cracks and microfissures in said layer of glass and minimizing the passage of oxygen and moisture and air through any cracks or microfissures in said layer of glass to preserve the stoichiometry of said underlying, absorber material.

2. An improved photovoltaic cell according to claim 1 wherein said barrier member is a layer of copper oxide, and said absorber is a copper bearing material.

3. An improved photovoltaic device according to claim 2 wherein said absorber is a copper-bearing material selected from the group consisting of copper sulfide, copper indium sulfide and copper indium selenide.

4. An improved photovoltaic cell according to claim 2 wherein said absorber comprises copper sulfide and said collector comprises a material selected from the group consisting of cadmium sulfide and zinc cadmium sulfide.

5. An improved photovoltaic cell according to claim 2 wherein said glass is alumino-borosilicate glass having a thickness in excess of about 1 micron and less than about 30 microns.

6. An improved photovoltaic cell according to claim 1 wherein the cell is a cadmium sulfide/copper sulfide front wall type cell.

7. An improved photovoltaic cell according to claim 1 wherein said first electrical contact means is a transparent electrical contact in grid form, and said barrier member is located between said absorber and said transparent electrical contact.

8. An improved photovoltaic cell according to claim 1 wherein said first electrical contact is a transparent electrical contact in grid form disposed between said absorber and said barrier member.

9. In a method for fabricating a photovoltaic device comprising the steps of providing a first electrical contact, depositing a layer of collector material on said first electrical contact, depositing a layer of absorber material on said collector to form a junction therebetween, and applying a second electrical contact and transparent encapsulation means to said absorber, the improvement being: applying the encapsulation means by the steps of depositing on said absorber a composite layer of a barrier member having a thickness between 100 and 10,000 angstroms and an overlying thin layer of glass, selecting as said barrier member a material which is chemically and electrically compatible with the material of said absorber and which functions to minimize the occurrence of cracks and microfissures in said layer of glass and further to minimize the passage of oxygen and moisture and air through any cracks or microfissures in said layer of glass to thereby preserve the stoichiometry of said underlying absorber material, and depositing said layer of glass directly on said barrier member with said barrier member functioning to facilitate the bonding of said layer of glass to the rest of said device.

10. The improved method of claim 9 wherein copper oxide is selected as said barrier member material, and said glass layer is alumino-borosilicate glass deposited to a thickness in excess of about 1 micron and less than about 30 microns.

11. The improved method of claim 10 further including the step of heating said absorber in a reducing atmosphere prior to depositing said layer of copper oxide.

12. The improved method of claim 10 wherein said absorber is deposited on said collector by depositing a layer of a copper-bearing absorber material on said collector.

13. The improved method of claim 9 wherein said composite layer is deposited after the absorber stoichiometry has been optimized.

14. The improved method of claim 9 wherein said barrier member is deposited by vacuum evaporation.

15. The improved method of claim 9 wherein said barrier member is deposited by sputtering.

* * * * *

UNITED STATES PATENT OFFICE
CERTIFICATE OF CORRECTION

Patent No. 4,239,553          Dated December 16, 1980

Inventor(s) Allen M. Barnett et al

It is certified that error appears in the above-identified patent and that said Letters Patent are hereby corrected as shown below:

Column 1, line 44, "devide" should be -- device --.

Column 2, line 9, "coat" should be -- cost --.

Column 5, line 16, "sulfate" should be -- sulfide --.

Signed and Sealed this

Nineteenth Day of May 1981

[SEAL]

Attest:

RENE D. TEGTMEYER

Attesting Officer    Acting Commissioner of Patents and Trademarks